United States Patent [19]
Taniguchi et al.

[11] Patent Number: 5,404,035
[45] Date of Patent: Apr. 4, 1995

[54] MULTI-VOLTAGE-LEVEL MASTER-SLICE INTEGRATED CIRCUIT

[75] Inventors: Hideki Taniguchi; Ichiro Tomioka; Kunihiko Sanada; Masatomi Okabe, all of Itami, Japan

[73] Assignee: Mitsubishi Denki Kabushiki Kaisha, Tokyo, Japan

[21] Appl. No.: 75,211

[22] Filed: Jun. 10, 1993

[30] Foreign Application Priority Data

Jun. 11, 1992 [JP] Japan .................. 4-152131

[51] Int. Cl.⁶ .................. H01L 27/10; H01L 27/02
[52] U.S. Cl. .................. 257/207; 257/206; 257/371
[58] Field of Search .................. 257/202-211

[56] References Cited

U.S. PATENT DOCUMENTS

| | | | |
|---|---|---|---|
| 4,511,914 | 4/1985 | Remedi et al. | 257/207 |
| 4,764,798 | 8/1988 | Kawabata | 257/206 |
| 4,771,327 | 9/1988 | Usui | 257/206 |
| 4,780,846 | 10/1988 | Tanabe et al. | 257/207 |
| 4,989,062 | 1/1991 | Takahashi et al. | 257/207 |
| 4,992,845 | 2/1991 | Arakawa et al. | 257/203 |
| 5,063,429 | 11/1991 | Crafts | 257/203 |
| 5,075,753 | 12/1991 | Kozono | 257/207 |
| 5,347,150 | 9/1994 | Sakai et al. | 257/207 |

FOREIGN PATENT DOCUMENTS

| | | |
|---|---|---|
| 1257348 | 10/1989 | Japan . |
| 127332 | 11/1989 | Japan . |
| 237749 | 2/1990 | Japan . |
| 2298066 | 12/1990 | Japan . |
| 360054 | 3/1991 | Japan . |

*Primary Examiner*—Gene M. Munson
*Attorney, Agent, or Firm*—Christopher R. Pastel; Thomas R. Morrison

[57] ABSTRACT

A master-slice semiconductor integrated circuit device includes a substrate for an input/output circuit section, which is segmented into a plurality of segments during a master processing step. In a slice processing step, slice cells are formed, using different substrate segments. Input/output circuits are formed by respective slice cells so that desired different supply voltages can be applied to input/output circuits on different substrate segments.

3 Claims, 9 Drawing Sheets

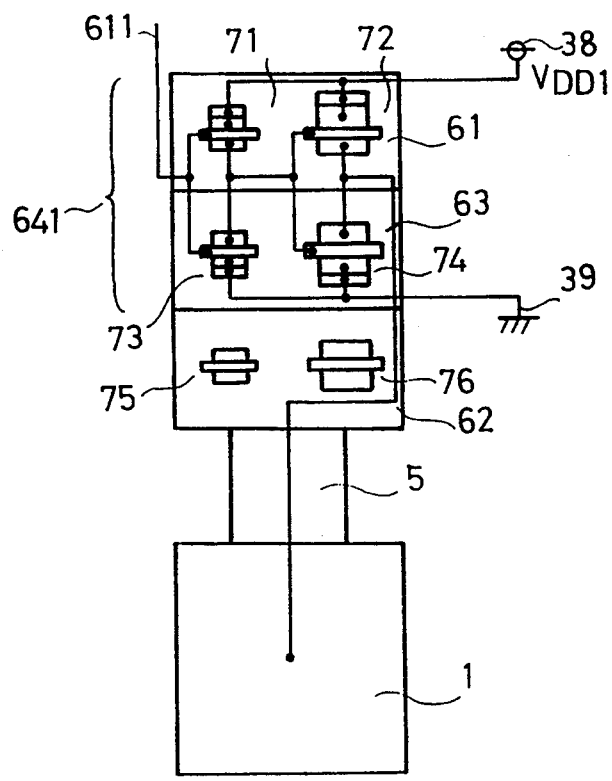
F I G. 11(a)
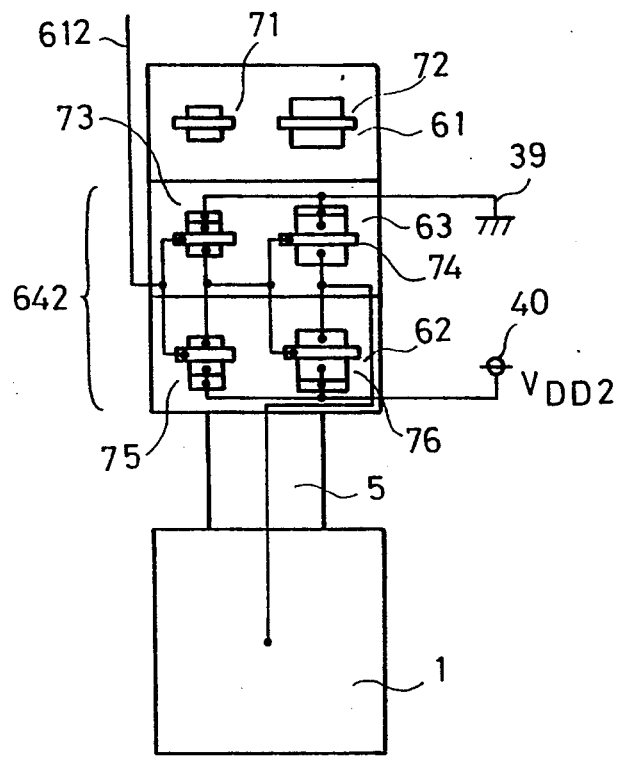
F I G. 11(b)

MULTI-VOLTAGE-LEVEL MASTER-SLICE INTEGRATED CIRCUIT

The present invention relates to a semiconductor integrated circuit device of master-slice type, in which a substrate of an input/output circuit section is divided into a plurality of areas so that different supply voltages can be used for respective areas.

BACKGROUND OF THE INVENTION

In FIG. 1, a conventional master-slice type semiconductor integrated circuit device chip. Around an internal area 2 in which an internal integrated circuit is to be arranged, a first substrate area 3 of a first conductivity type divided into segments 3-1, ..., 3-n and a second substrate area 4 of a second conductivity type divided into segments 4-1, ..., 4-n are disposed. The respective substrate areas are connected by metallic wiring 5 to input/output pads 1.

FIG. 2 is an enlarged view of one cell constituting the input/output section within a broken line rectangle 6 in FIG. 1. In FIG. 2, as in FIG. 1, the cell includes an input/output pad 1, a first substrate segment 3-6 of the first conductivity type, a second substrate segment 4-6 of the second conductivity type, and metallic wiring 5.

FIG. 3 is a cross-sectional view of cell 6 of FIG. 1 or cell 6 through substrate segments 3-6 and 4-6 of FIG. 2. In FIG. 3, first substrate segment 3-6 of the first conductivity type and second substrate segment 4-6 of the second conductivity type are disposed in a semiconductor substrate 16. When first substrate segment 3-6 is of, for example, n-type, MOS diffusion regions 7 of the second conductivity type or p-type are formed in first substrate segment 1. MOS diffusion regions 8 of the first conductivity type or n-type are formed within p-type second substrate segment 4-6. There are further disposed a second conductivity type MOS gate 9 and a first conductivity type MOS gate 10. Thus, a first conductivity MOS transistor and a second conductivity type MOS transistor are formed. A first voltage supply terminal 11 to which a supply voltage of, for example, $V_{DD}$, is applied is connected one of second conductivity type MOS diffusion regions 7 and also to a region 13 of first conductivity type. A second voltage supply terminal 12 at ground potential is connected to one of first conductivity type MOS diffusion regions 8 and also to a region 14 of the second conductivity type. A plurality of such second conductivity type MOS transistors are formed in one first conductivity type first substrate segment 3-6, and a plurality of such first conductivity type MOS transistors are formed in one second conductivity type second substrate segment 4-6.

In the conventional semiconductor integrated circuit device shown in FIG. 1, supply voltage $V_{DD}$ is applied to first conductivity type first substrate area 3, and ground potential is applied to second conductivity type second substrate area 4. In single cell 6 of FIG. 1 or the cell of the input/output circuit shown in FIG. 2, a plurality of second conductivity type MOS transistors in first substrate segment 3-6 and a plurality of first conductivity type MOS transistors in second substrate segment 4-6 are used to form inverter circuits to thereby provide an input/output circuit which couples input/output pad 1 and an integrated circuit formed within internal area 2.

As is well known, a master-slice LSI is processed in a master process until the step for forming transistors, and contact holes, metallic wiring layers, through-holes etc. are formed in the following slice process to complete an LSI. With respect to the arrangement shown in FIG. 2, a desired LSI is formed by arranging cells having the same slice processing data as those slice cells on the respective substrate segments on the master shown in FIG. 1.

In the above-described conventional master-slice semiconductor integrated circuit device, substrate areas 3 and 4 are both common to all the chips on the entire chip. Accordingly, if different supply voltages are used for one input/output circuit cell which are different from supply voltages used for another cell, current will flow through the respective substrate areas between the different voltage supply devices, which would disadvantageously cause generation of heat in tile substrate areas and increase in power consumption.

For example, Japanese Unexamined Patent Publication No. HEI 1-27332 discloses an LSI device which permits application of different supply voltages to a plurality of cells disposed on an integrated circuit chip. Separate wells are provided for a plurality of internal cells disposed within an internal cell area, and a plurality of voltage supply wires are disposed for applying different voltages to contact regions of the respective wells. Desired ones of such voltage supply wires are chosen for connection to desired wells. The invention disclosed in this Japanese Unexamined Patent Publication HEI 1-27332 is not directed to a cell structure which enables application of a plurality of supply voltages to input/output circuits which connect wells or substrate areas of internal cells to external circuits.

Japanese Unexamined Patent Publication No. HEI 1-257348 discloses an arrangement for preventing a voltage applied to small-current circuit cells arranged on a chip from being affected by other larger-current circuit cells on the same chip, a power supply circuit is provided in which substrate terminals for coupling a supply voltage to the chip substrate and voltage supply terminals each for coupling a supply voltage to the circuits in each cell are separately provided, and in order to connect the respective terminals to appropriate power supply pads for external connection are connected by either a first power supply wiring arrangement or a second power supply wiring arrangement. However, this publication does not mention at all an input/output circuit cell structure for applying a plurality of different supply voltages to input/output circuits. Further, there is no disclosure in this publication of selecting supply voltages for individual input/output circuit cells in the slice process.

Japanese Unexamined Patent Publication No. HEI 2-298066 discloses an arrangement in which a voltage supply circuit arrangement for a semiconductor integrated circuit device is divided into two parts, one for a group of Bi-MOS logic circuits and one for a group of CMOS logic circuits, for applying different supply voltages to the respective groups. However, there is no teaching as to how two supply voltages are externally applied or as to what structures input/output circuit cells have.

SUMMARY OF THE INVENTION

According to the present invention, problems encountered in the above-discussed prior art semiconductor integrated circuit devices can be eliminated by providing a master-slice semiconductor integrated circuit device in which a supply voltage to be applied to a substrate segment of each input/output circuit can be selected as desired in the slice process so that a plurality of different supply voltages can be applied to a single semiconductor integrated circuit device.

A semiconductor integrated circuit device according to a first feature of the present invention includes a substrate for an input/output circuit section which has been divided into a plurality of substrate segments by master processing, and common slice cells are used to form input/output circuits in a slice processing step so that different supply voltages can be applied to input/output circuits on different substrate segments.

A semiconductor integrated circuit device according to a second feature of the present invention includes a substrate for an input/output circuit section which has been divided into a plurality of substrate segments in a master processing step. At least two types of slice cells corresponding to the number of supply voltages to be applied to the substrate segments are provided. Input/output circuits are formed of circuit elements on respective ones of the two types of slice cells on respective substrate segments so that different supply voltages can be used for input/output circuits on the different substrate segments.

A semiconductor integrated circuit device according to a third feature of the present invention includes a substrate for an input/output circuit section which has been divided into a plurality of substrate segments in a master processing step. At least two types of slice cells corresponding to the number of supply voltages to be applied to the substrate segments are provided in a master processing step. Circuit elements on respective ones of the two types of slice cells on respective substrate segments are used to form respective input/output circuits, so that different supply voltages can be applied to input/output circuits on different substrate segments. A substrate segment to which a reference (ground) potential is applied is used in common to input/output circuits in a slice processing step.

A semiconductor integrated circuit device according to a fourth feature of the present invention includes a substrate for an input/output circuit section which has been divided into a plurality of substrate segments in a master processing step. At least two types of slice cells corresponding to the number of supply voltages to be applied to the substrate segments are provided in a master processing step. A pre-driver stage of each input/output circuit is formed by circuit elements disposed on a substrate segment to which a lower supply voltage is applied, and a main driver stage driven by the pre-driver stage is formed by circuit elements disposed on a substrate segment to which a higher supply voltage is applied. A substrate segment to which a reference (ground) potential is applied is used in common to input/output circuits in a slice processing step.

In a semiconductor integrated circuit device embodying one of the first through third features, because only those input/output circuits operating from the same supply voltage are formed on the same substrate segment in a slice processing step, no current will flow between a plurality of voltage supply devices through a substrate. In addition, an optimum supply voltage can be applied to input/output circuits on one substrate segment without affecting input/output circuits on other substrate segments.

A semiconductor integrated circuit device embodying the fourth feature of the invention also has the above-described advantage and, in addition, an advantage that optimum voltages can be applied to the pre-driver and main driver stages, respectively.

BRIEF DESCRIPTION OF THE DRAWINGS

FIG. 11(a) shows a layout of a slice cell portion in the chip of FIG. 10 in which a first slice cell is disposed, and FIG. 11(b) shows a layout of a slice cell portion in the chip of FIG. 10 in which a second slice cell is disposed;

DETAILED DESCRIPTION OF PREFERRED EMBODIMENTS

Figure 1:
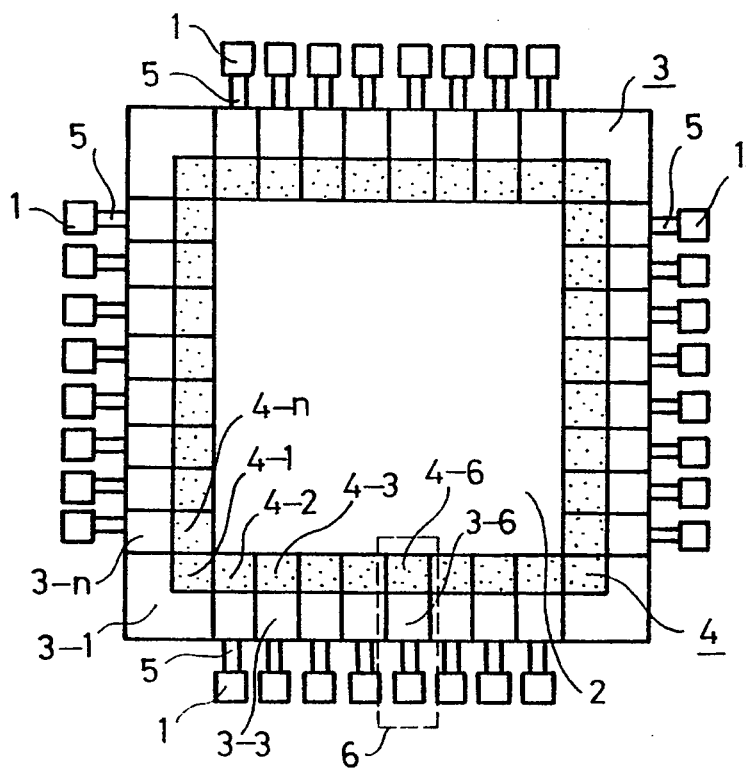
FIG. 1 shows a chip of a conventional semiconductor integrated circuit device.
Figure 2:
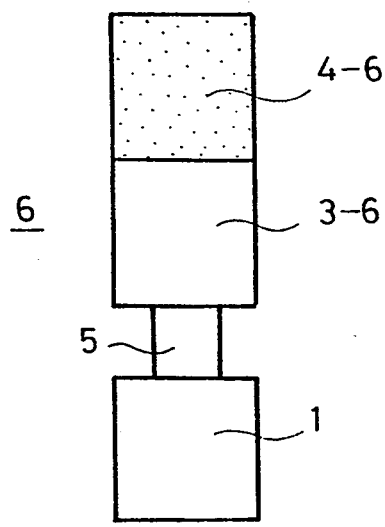
FIG 2 is an enlarged view of one cell of the semiconductor integrated circuit device shown in FIG. 1.

Now, the present invention is described with reference to some preferred embodiments shown in the drawings. It should be noted that the semiconductor integrated circuit devices of the present invention, like the conventional device shown in FIG. 1, include input/output pads 1, an internal region 2, and metallic wiring 5.

Embodiment 1

Figure 4:
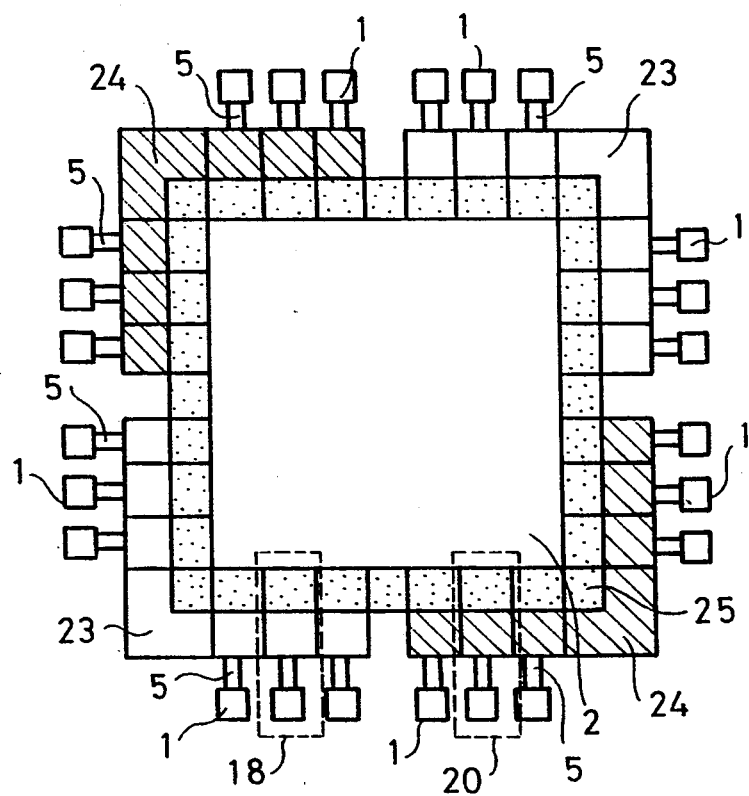
FIG. 4 shows a chip of a master-slice semiconductor integrated circuit device according to a first embodiment of the present invention.
Figure 5A:
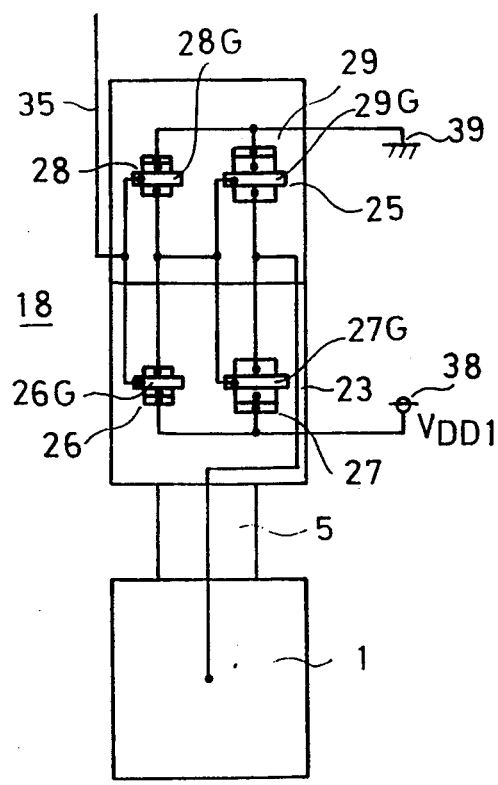
FIG. 5(a) shows a layout of a slice cell disposed in a first cell portion of the chip of FIG. 4.
Figure 5B:
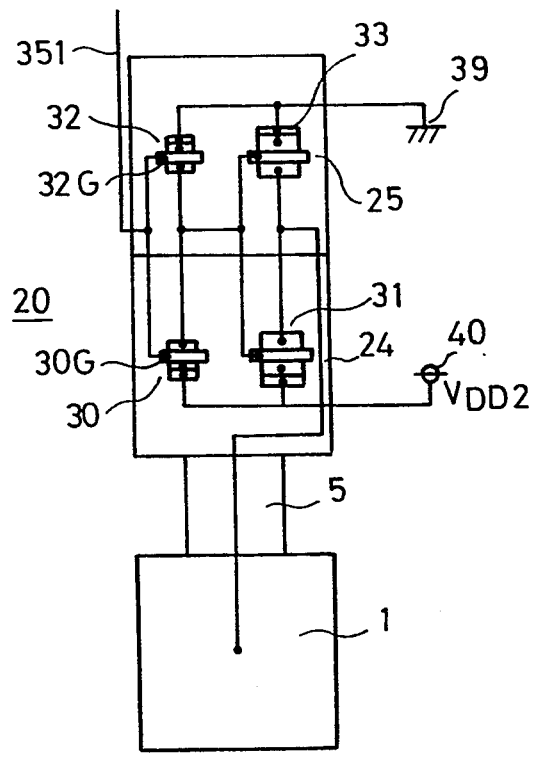
FIG. 5(b) shows a layout of a slice cell disposed in a second cell portion of the chip of FIG. 4.

FIG. 4 shows a chip of a semiconductor integrated circuit device according to a first embodiment of the present invention. According to the first embodiment shown in FIG. 4, a first substrate segment 23 and a second substrate segment 24 which are of a first conductivity type and isolated from each other, and a second conductivity type third substrate segment 25 are provided. FIG. 5(a) shows a layout of a slice cell disposed in a first cell portion including part of first substrate 23 and part of third substrate 25, which is within a broken-line rectangle 18 in FIG. 4. FIG. 5(b) shows a layout of a slice cell disposed in a second cell portion including part of second substrate 24 and part of third substrate 25, which is within a broken-line rectangle 20 in FIG. 4.

According to the first embodiment of the present invention, during the master processing, a substrate of the input/output circuit section is segmented into three segments, namely, first conductivity type first substrate segment 23 which is supplied with a first supply voltage $V_{DD1}$, first conductivity type second substrate segment 24 which is supplied with a second supply voltage $V_{DD2}$, and second conductivity type third substrate segment 25 which is supplied with a reference (ground) potential.

In the subsequent slice processing step, slice cells of the same layout are disposed as shown in FIGS. 5(a) and 5(b). More specifically, on first substrate segment 23 shown in FIG. 5(a), first conductivity type MOS transistors 26 and 27 are disposed, while second conductivity type MOS transistors 28 and 29 are disposed on third substrate segment 25. In FIG. 5(b), first conductivity MOS transistors 30 and 31 are disposed on second substrate segment 24, while second conductivity type MOS transistors 32 and 33 are disposed on third substrate segment 25.

In FIG. 5(a), transistors 26 and 28 are connected by metallic wiring within the slice cell to form a first inverter circuit, and transistors 27 and 29 are connected to form a second inverter circuit in cascade with the first inverter circuit. More specifically, gates 26G and 28G of transistors 26 and 28 are connected together and also to an integrated circuit disposed in internal region 2 by wiring 35. The drains of transistors 26 and 28 are connected together to mutually connected gates 27G and 29G of transistors 27 and 29. The drains of transistors 27 and 29 are connected together to an input/output pad 1. The sources of transistors 26 and 27 disposed on first substrate segment 23 are connected to a first supply voltage terminal 38 to which a voltage of $V_{DD1}$ is applied, while the sources of transistors 28 and 29 disposed on third substrate segment 25 are connected to a point of ground potential 39. Thus, the arrangement shown in FIG. 5(a) is an input/output circuit including two cascade-connected inverters which connects an integrated circuit within internal region 2 and an input/output pad 1.

The slice cell shown in FIG. 5(b), like the one shown in FIG. 5(a), forms an input/output circuit which includes a cascade-connection of a first inverter circuit formed by transistors 30 and 32 and a second inverter formed by transistors 31 and 33. The sources of transistors 30 and 31 disposed on second substrate segment 24 are connected to a second voltage supply terminal 40 which receives voltage $V_{DD2}$, while the sources of transistors 32 and 33 disposed on third substrate segment 25 are connected to point of ground potential 39. Gates 30G and 32G of transistors 30 and 32 are connected together and also to an integrated circuit disposed within internal region 2 by means of wiring 351, and the drains of transistors 31 and 33 are connected together to an input/output pad 1.

Figure 3:
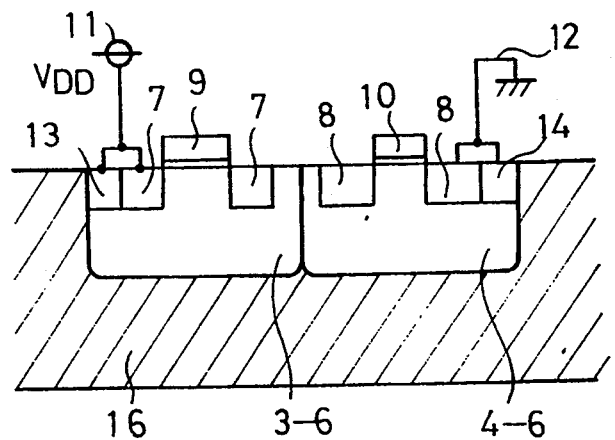
FIG. 3 is a cross-sectional view of one cell of the semiconductor integrated circuit device shown in FIG. 1.
Figure 6:
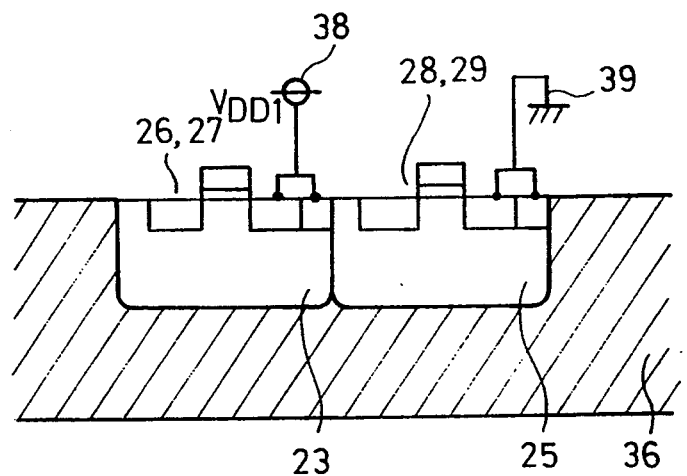
FIG. 6(a) shows a longitudinal cross-section of the first cell portion of the chip of FIG. 4.
FIG. 6(b) shows a longitudinal cross-section of the second cell portion of the chip of FIG. 4.
Figure 6:
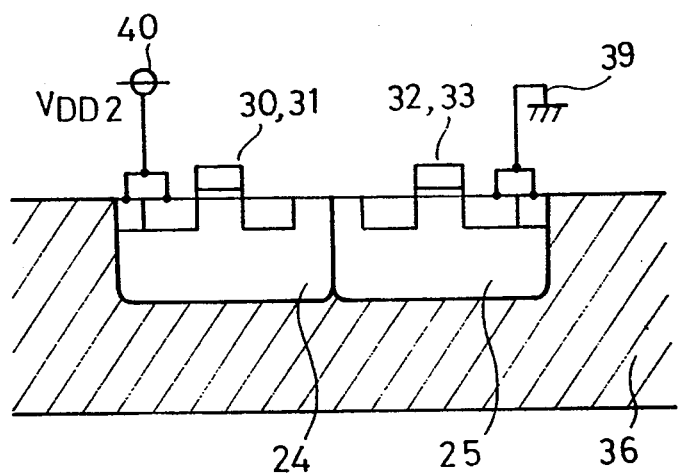

FIG. 6(a) shows the cross-section of the slice cell of FIG. 5(a). First substrate segment 23 of the first conductivity type and third substrate segment 25 of the second conductivity type are formed within a semiconductor substrate 36, being electrically separated from each other. Transistors 26 and 27 are disposed within first substrate segment 23, in a similar manner to that shown in FIG. 3 which shows a cross-section of a conventional device, with the sources of these transistors connected to first voltage supply terminal 38. Similarly, transistors 28 and 29 are disposed within third substrate segment 25, with their sources connected to ground potential point 39. Transistors 26-29 are interconnected by metallic wires within the slice cell.

FIG. 6(b) shows the cross-section of the slice cell of FIG. 5(b). Second substrate segment 24 of the first conductivity type and third substrate segment 25 of the second conductivity type are formed within semiconductor substrate 36, being electrically separated from each other. Transistors 30 and 31 are disposed in second substrate segment 24, and transistors 32 and 33 are disposed in third substrate segment 25. Transistors 30-33 are interconnected by means of metallic wires within the slice cell so as to form the input/output circuit including the two inverters described with reference to FIG. 5(b). The sources of transistors 30 and 31 are connected to second voltage supply terminal 40, while the sources of transistors 32 and 33 are connected to ground potential point 39.

In the semiconductor integrated circuit device according to the first embodiment, first substrate segment 23 and second substrate segment 24 to which different supply voltages $V_{DD1}$ and $V_{DD2}$ are applied are separated from each other, and, therefore, there is no possibility that current may undesirably flow through the substrate between the two voltage supplies. In addition, by virtue of this fact, it is possible to freely choose optimum voltages for optimum circuit operation for the circuits disposed on the respective substrate segments.

Embodiment 2

Figure 7:
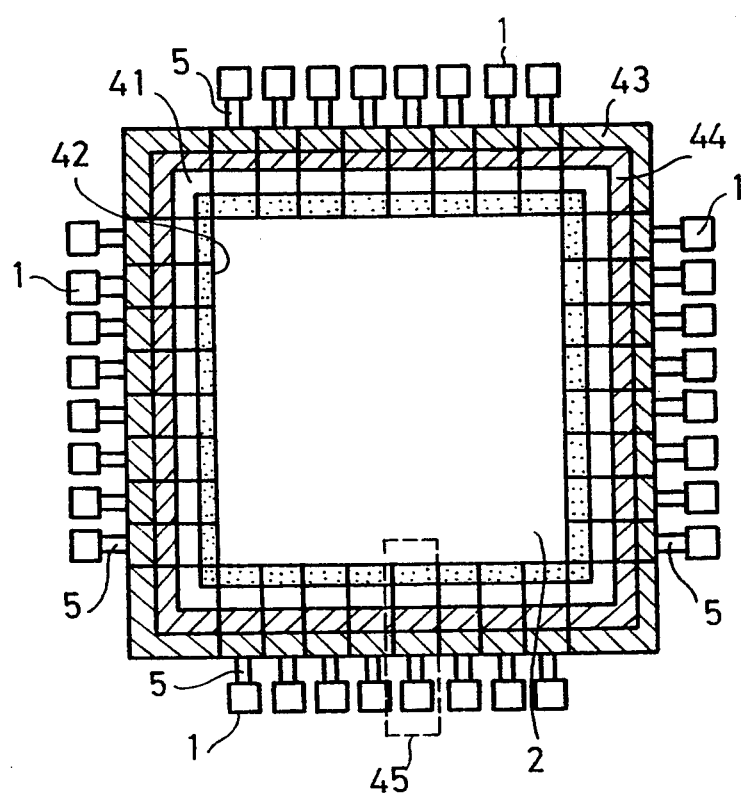
FIG. 7 shows a chip of a master-slice semiconductor integrated circuit device according to a second embodiment of the present invention.
Figure 8A:
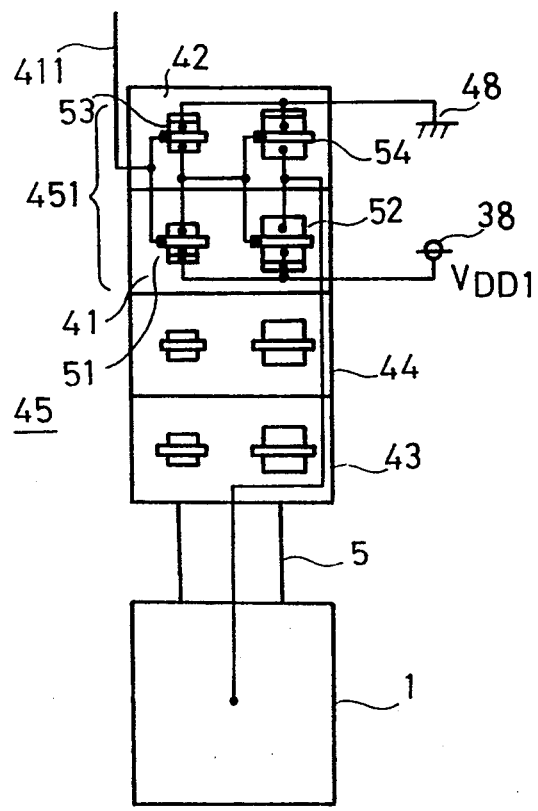
FIG. 8(a) shows a layout of a slice cell portion in the chip of FIG. 7 in which a first slice cell is disposed.
Figure 8B:
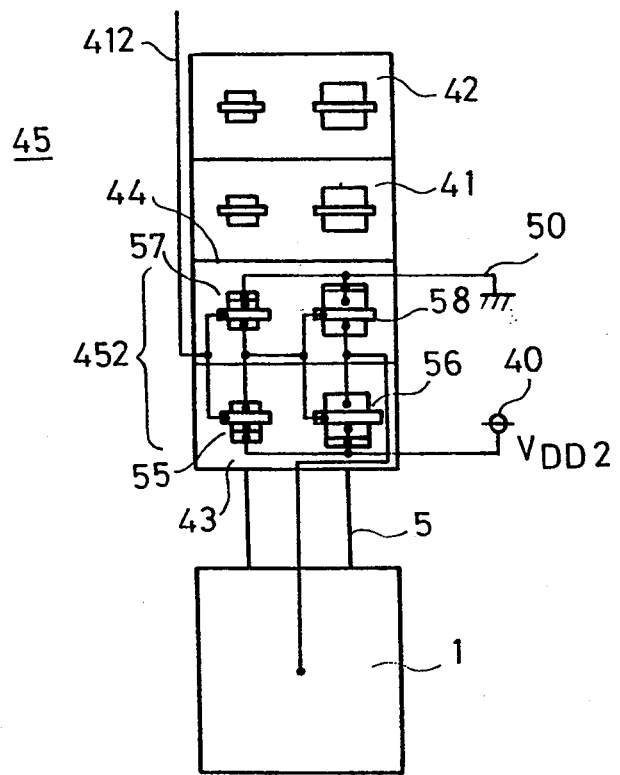
FIG. 8(b) shows a layout of a slice cell portion in the chip of FIG. 7 in which a second slice cell is disposed.

FIG. 7 shows a chip of a semiconductor integrated circuit device according to a second embodiment of the present invention. A substrate is separated into a first substrate segment 41 of a first conductivity type, a second substrate segment 42 of a second conductivity type, a third substrate segment 43 of the first conductivity type, and a fourth substrate segment 44 of the second conductivity type. FIGS. 8(a) and 8(b) show layouts of one cell portion within a broken-line rectangle 45 in FIG. 7, in which slice cells including MOS transistors are disposed.

In this embodiment, during the master processing step, a substrate for an input/output circuit section is segmented into four substrate segments, namely, first conductivity type first substrate segment 41 to which a first supply voltage $V_{DD1}$ is applied, second conductivity type second substrate segment 42 to which a first reference potential (ground potential) is applied, first conductivity type third substrate segment to which a second supply voltage $V_{DD2}$ is applied, and second conductivity type fourth substrate segment 44 to which a second reference (ground) potential is applied. In the subsequent slice step, at least two types of slice cells operating from different substrate voltages are formed as shown in FIGS. 8(a) and 8(b).

For example, as shown in FIG. 8(a), transistors 51-54 disposed on first and second substrate segments 41 and 42 which form a first input/output cell 451 are interconnected by means of metallic wiring within the slice cell to form a first input/output circuit including, for example, two cascaded inverters. The sources of transistors 51 and 52 disposed on first substrate segment 41 are connected to a first voltage supply terminal 38 to which first supply voltage $V_{DD1}$ is applied, and the sources of transistors 53 and 54 disposed on second substrate segment 42 are connected to a point of first reference potential 48. The gates of transistors 51 and 53 are connected together to an integrated circuit within an internal region 2 by means of wiring 411. The drains of transistors 52 and 54 are connected together to an input-/output pad 1.

As shown in FIG. 8(b), transistors 55–58 on third and fourth substrate segments 43 and 44 which form a second input/output cell 452 are interconnected by means of metallic wiring within the slice cell to form a second input/output circuit including, for example, two cascaded inverters. The sources of transistors 55 and 56 disposed on third substrate segment 43 are connected to a second voltage supply terminal 40 to which second supply voltage $V_{DD2}$ is applied, and the sources of transistors 57 and 58 on fourth substrate segment 44 are connected to a point of second reference potential 50. The gates of transistors 55 and 57 are connected together to an integrated circuit within internal region 2 by means of wiring 412. The drains of transistors 56 and 58 are connected together to an input/output pad 1.

Figure 9:
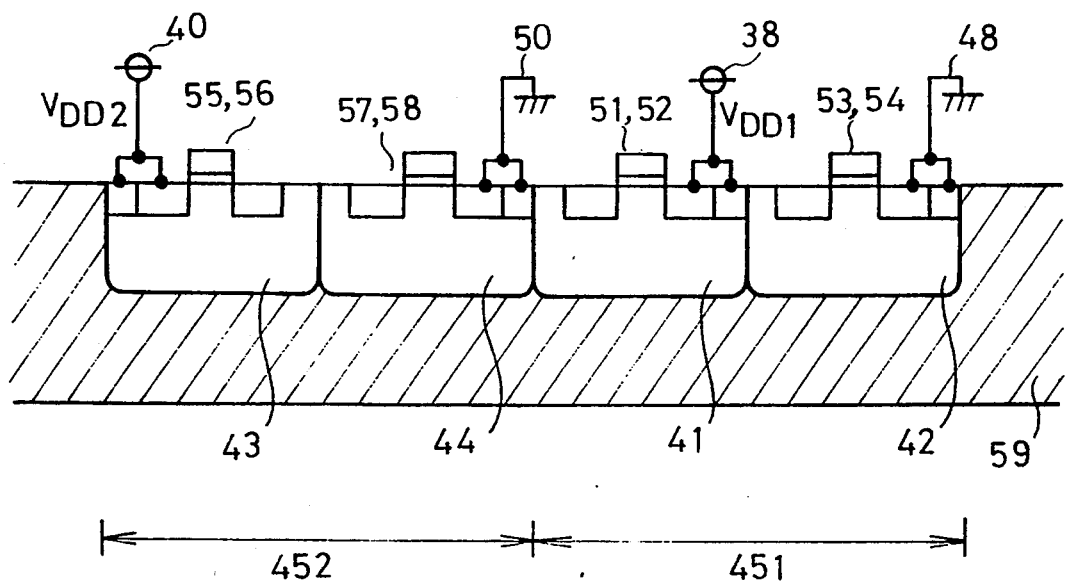
FIG. 9 is a longitudinal cross-sectional view of one cell portion in the chip of FIG. 7.

FIG. 9 is a longitudinal cross-sectional view of the structures of FIGS. 8(a) and 8(b) which are shown combined for simplicity of explanation. Within a semiconductor substrate 59, first substrate segment 41 of the first conductivity type, second substrate segment 42 of the second conductivity type, third substrate segment 43 of the first conductivity type, and fourth substrate segment 44 of the second conductivity type are disposed, being mutually electrically separated. Transistors 51 and 52 are disposed in first substrate segment 41, transistors 53 and 54 are disposed in second substrate segment 42, transistors 55 and 56 are disposed in third substrate segment 43, and transistors 57 and 58 are disposed in fourth substrate segment 44. Appropriate ones of these transistors are connected by means of metallic wiring within the slice cells to provide input/output circuits each including two inverter circuits as required, as explained with reference to FIGS. 8(a) and 8(b). Depending on the natures of the slice cells disposed on substrate segments 41–44, the sources of transistors 51 and 52 on first substrate segment 41 may be connected to first voltage $V_{DD1}$ supply terminal 38, the sources of transistors 53 and 54 on second substrate segment 42 may be connected to first ground potential point 48, the sources of transistors 55 and 56 on third substrate segment 43 may be connected to second voltage $V_{DD2}$ supply terminal 40, and the sources of transistors 57 and 58 on fourth substrate segment 44 may be connected to second ground potential point 50, as described above with reference to FIGS. 8(a) and 8(b).

Since substrates 41 and 43 to which $V_{DD1}$ and $V_{DD2}$ are applied, respectively, are electrically separated from each other, no current will flows through the substrate between the two voltage supplies. In a cell portion, e.g. the one indicated by a broken line rectangle 45 in FIG. 7, one of at least two types of slice cells, such as shown in FIGS. 8(a) and 8(b), can be selectively disposed, so that desired ones of input/output terminals of the same design on the chip can be used for input/output circuits operating at any desired operating voltages.

Embodiment 3

Figure 10:
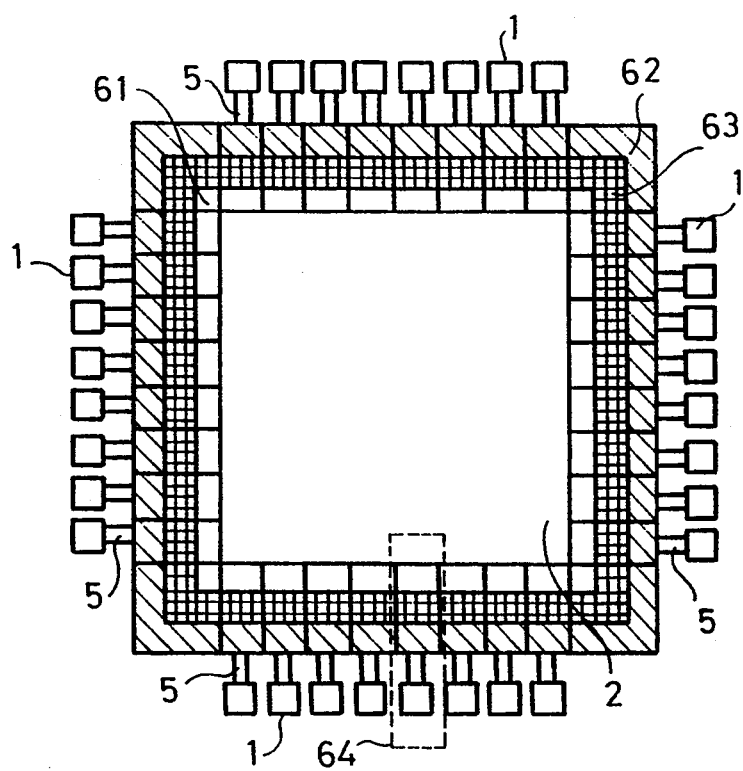
FIG. 10 shows a chip of a master-slice semiconductor integrated circuit device according to a third embodiment of the present invention.

FIG. 10 shows a chip of a semiconductor integrated circuit device according to a third embodiment of the present invention. A substrate is divided into a first substrate segment 61 of a first conductivity type, a second substrate segment 62 of the first conductivity type, and a third substrate segment 63 of a second conductivity type. FIGS. 11(a) and 11(b) each shows a layout of one cell portion indicated by a broken line rectangle 64 in FIG. 10 in which a slice cell is disposed.

In this embodiment, during the master step, a substrate portion for an input/output circuit section is divided into three segments, namely, first substrate segment 61 of the first conductivity type to which a first supply voltage $V_{DD1}$ is applied, third substrate segment 63 of the second conductivity type to which a reference (ground) potential is applied, and second substrate segment 62 of the first conductivity type to which a second supply voltage $V_{DD2}$ is applied. In the subsequent slice step, at least two types of slice cells such as ones shown in FIGS. 11(a) and 11(b) which operates with difference substrate voltages are formed. For example, as shown in FIG. 11(a), MOS transistors 71 and 72 and 73 and 74 are disposed respectively on first and third substrate segments 61 and 63 which form a first input/output cell 641, and are interconnected by metallic wiring in the slice cells to thereby form a first input/output circuit including, for example, two cascaded inverters. The sources of transistors 71 and 72 on first substrate segment 61 are connected to a first voltage supply terminal 38 to which a first supply voltage $V_{DD1}$ is applied, and the sources of transistors 73 and 74 disposed on third substrate segment 63 are connected to a point of reference (ground) potential 39. The gates of transistors 71 and 73 are connected together to an integrated circuit in an internal region 2 by means of wiring 611. The drains of transistors 72 and 74 are connected together to an input/output pad 1.

NOS transistors 73 and 74 and 75 and 76 are disposed respectively on second substrate segment 62 and third substrate segment 63 which form a second input/output cell 642, and are interconnected by means of metallic wiring within the slice cells to form a second input/output circuit including, for example, two cascaded inverters, as shown in FIG. 11(b). The sources of transistors 75 and 76 on second substrate segment 62 are connected to a second voltage supply terminal 40 to which a second supply voltage $V_{DD2}$ is applied, and the sources of transistors 73 and 74 disposed on third substrate segment 63 are connected to ground potential point 39. The gates of transistors 73 and 75 are connected together to an integrated circuit within internal region 2 by means of wiring 612. The drains of transistors 74 and 76 are connected together to an input/output pad 1.

Figure 12:
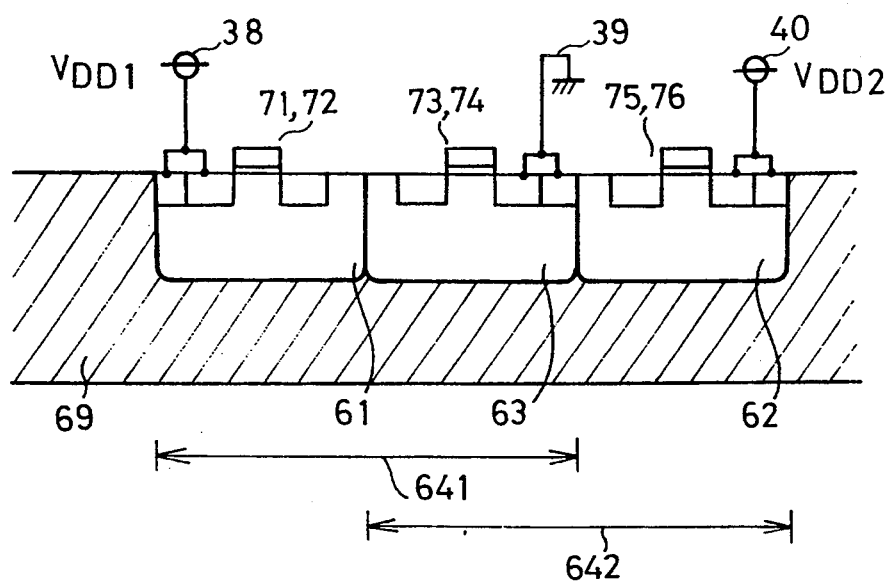
FIG. 12 is a longitudinal cross-sectional view of one cell portion/in the chip of FIG. 10.

FIG. 12 is a longitudinal cross-sectional view of the structures of FIGS. 11(a) and 11(b) which are shown combined for simplicity of explanation. First conductivity type first substrate segment 61, first conductivity type second substrate segment 62 and second conductivity type third substrate segment 63 are formed in a semiconductor substrate 69, being electrically separated from each other. First substrate segment 61 includes transistors 71 and 72 formed therein, second substrate segment 62 includes transistors 75 and 76 formed therein, and third substrate segment 63 includes transistors 73 and 74 formed therein. As described with reference to FIGS. 11(a) and 11(b), these transistors are interconnected by metallic wiring within the slice cells to provide input/output circuits each including two stage inverter circuits. As described previously, first input/output cell 641 includes first and second substrate segments 61 and 63, with the sources of transistors 71 and 72 on first substrate segment 61 connected to first voltage $V_{DD2}$ supply terminal 38, and with the sources of transistors 73 and 74 on third substrate segment 63 connected to ground potential point 39. Second input- /output cell 642 includes second and third substrate segments 62 and 63. The sources of transistors 75 and 76 on second substrate segment 62 are connected to second voltage $V_{DD2}$ supply terminal 40, while the sources of transistors 73 and 74 on third substrate segment 63 are connected to ground potential point 39.

In this third embodiment, too, substrates 61 and 62 to which $V_{DD1}$ and $V_{DD2}$ are coupled are electrically separated from each other and, therefore, no current flows through the substrate between the two voltage supplies. Further, one of at least two types of slice cells corresponding to a desired one of different supply voltages can be formed in an input/output cell portion 64 indicated by a broken-line rectangle in FIG. 10, as shown in FIG. 11(a) or 11(b), so that desired ones of input/output terminals of the same design on the chip can be used for input/output circuits operating at any desired operating voltages. Moreover, according to this third embodiment, because third substrate segment 63 of the second conductivity type, in slice cells, to which ground potential is applied are used in common to two types of input/output cells 641 and 642, the area for cells can be reduced.

Figure 13:
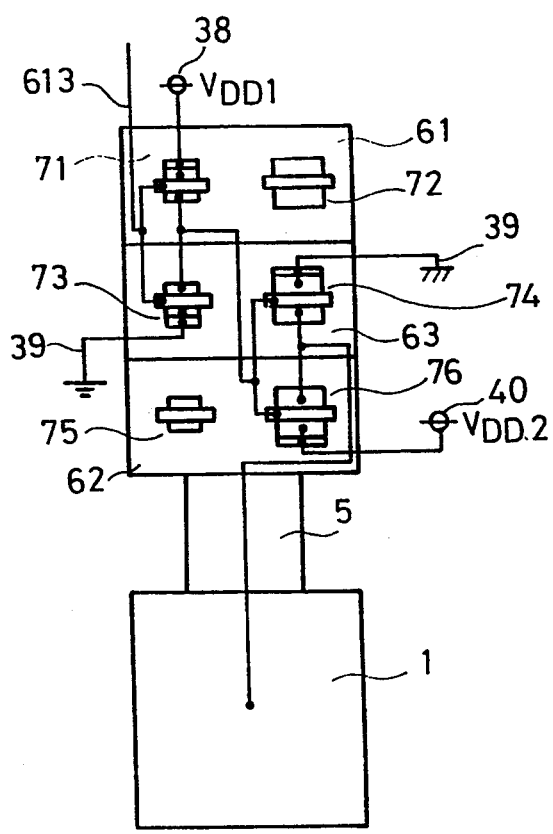
FIG. 13 Shows a layout of one cell portion in the chip of FIG. 10 in which a third slice cell is disposed.

FIG. 13 shows another input/output circuit which is formed by arranging a slice cell of a different layout using the same master as used in the third embodiment shown in FIG. 10. This input/output circuit comprises a pre-driver stage and a main driver stage. The pre-driver stage comprises a first inverter formed by transistor 71 on first substrate segment 61 and transistor 73 on third substrate segment 63, and the main driver stage comprises a second inverter including transistor 76 on second substrate segment 62 and transistor 74 on third substrate segment 63.

More specifically, the gates of transistors 71 and 73 are connected together to an integrated circuit within internal region 2 by wiring 613. Their drains are connected together to the mutually connected gates of transistors 74 and 76. The drains of transistors 74 and 76 are connected together to an input/output pad 1. The source of transistor 71 is connected to first lower voltage $V_{DD1}$ supply terminal 38, while the source of transistor 73 is connected to ground potential point 39. Thus, the pre-driver stage comprising transistors 71 and 73 operates with a low voltage. The source of transistor 74 is connected to ground potential point 39, while the source of transistor 76 is connected to second voltage supply terminal 40 providing higher supply voltage of $V_{DD2}$. Thus, the main driver stage comprising transistors 74 and 76 operates at a higher voltage.

The input/output circuit shown in FIG. 13 which includes the pre-driver stage and the main driver stage has a slightly lower switching speed in comparison with the circuit shown in FIG. 11(b), for example, but its power consumption is smaller. This circuit of FIG. 13 has a significantly faster switching speed than the circuit of FIG. 11(a), for example, which includes input and output inverters both operating at a lower operating voltage.

As described above, according to the present invention, a substrate region is segmented into a plurality of substrate segments in the master processing step, and an input/output circuit section is arranged in the slice processing step such that any desired supply voltages can be selected. Accordingly, a plurality of different supply voltages can be used as desired. Furthermore, because that supply voltage should be used can be selected as desired in the slice step, supply voltages for input/output terminals on the chip can be chosen individually. In addition, by choosing supply voltages for each input/output circuit such that a pre-driver stage is operated with a lower voltage, whereas a main driver stage is operated with a higher voltage, power consumption can be reduced, while maintaining required driving capability.

What is claimed is:

1. A multi-voltage-level master-slice semiconductor integrated circuit device comprising: an input/output circuit section having a substrate divided into a first substrate segment of a first conductivity type to which a first supply voltage is to be applied, a second substrate segment of the first conductivity type to which a second supply voltage is to be applied, and a third substrate segment of a second conductivity type to which a reference voltage is to be applied; an input/output cell including said first, second and third substrate segments, an input/output circuit comprising a cascade connection of a pre-driver stage and a main driver stage driven by said pre-driver stage, said pre-driver stage being formed of circuit elements disposed on said first and third substrate segments, said main driver stage being formed of circuit elements disposed on said second and third substrate segments.

2. A multi-voltage-level master-slice semiconductor integrated circuit device comprising:
   an input/output circuit section disposed about an edge of said device;
   said input/output circuit section having a substrate divided into a first substrate segment of a first conductivity type to which a first supply voltage is to be applied, a second substrate segment of the first conductivity type to which a second supply voltage is to be applied, and a third substrate segment of a second conductivity type to which a reference voltage is to be applied;
   means for isolating said first supply voltage of said first substrate segment from said second supply voltage of said second substrate segment;
   a first input/output cell including said first, second, and third substrate segments;
   said first input/output cell including a first input/output circuit having circuit elements disposed on said first and third substrate segments of said first input/output cell;
   a second input/output cell including said first, second, and third segments;
   said second input/output cell including a second input/output circuit having circuit elements disposed on said second and third substrate segments of said second input/output cell;
   said first, second, and third substrate segments being concentrically disposed about a periphery of the device; and
   said means for isolating including interposing said third segment between said first and second segments.

3. A multi-voltage-level master-slice semiconductor integrated circuit device comprising:
   an input/output circuit section disposed about an edge of said device;
   said input/output circuit section having a substrate divided into a first substrate segment of a first conductivity type to which a first supply voltage is to be applied, a second substrate segment of a second conductivity type to which a first reference voltage is to be applied, a third substrate segment of the first conductivity type to which a second supply voltage is to be applied, and a fourth substrate segment of the second conductivity type which a second reference voltage is to be applied;

means for isolating said first supply voltage of said first substrate segment from said second supply voltage of said third substrate segment;

a first input/output cell including said first, second, third and fourth substrate segments;

said first input/output cell including a first input/output circuit having circuit elements disposed on said first and second substrate segments of said first input/output cell;

a second input/output cell including said first, second, and third segments; and said second input/output cell including a second input/output circuit having circuit elements disposed on said third and fourth substrate segments of said second input/output cell;

said first, second, third and fourth segments being concentrically disposed about a periphery of the device; and said means for isolating including interposing one of said second and fourth segments between said first and third segments.

* * * * *